United States Patent

Hata et al.

[11] Patent Number: 5,569,954
[45] Date of Patent: Oct. 29, 1996

[54] EPITAXIAL $In_xGa_{(1-x)}As$ HAVING A SLANTED CRYSTALLOGRAPHIC PLANE AZIMUTH

[75] Inventors: Masahiko Hata; Noboru Fukuhara; Hiroaki Takata; Katsumi Inui, all of Ibaraki, Japan

[73] Assignee: Sumitomo Chemical Company Limited, Osaka, Japan

[21] Appl. No.: 302,766

[22] PCT Filed: Jan. 12, 1994

[86] PCT No.: PCT/JP94/00032

§ 371 Date: Sep. 13, 1994

§ 102(e) Date: Sep. 13, 1994

[87] PCT Pub. No.: WO94/16459

PCT Pub. Date: Jul. 21, 1994

[30] Foreign Application Priority Data

Jan. 13, 1993 [JP] Japan .................................. 5-003948

[51] Int. Cl.[6] ...................................... H01L 29/04
[52] U.S. Cl. ......................... 257/627; 257/628; 257/190; 257/192
[58] Field of Search ..................... 257/627, 628, 257/12, 14, 15, 22, 200, 190, 192

[56] References Cited

U.S. PATENT DOCUMENTS

| | | | |
|---|---|---|---|
| 3,821,783 | 6/1974 | Sugita et al. | 257/628 |
| 4,688,068 | 8/1987 | Chaffin et al. | 257/25 |
| 4,872,046 | 10/1989 | Morkoc et al. | 257/628 |
| 5,016,252 | 5/1991 | Hamada et al. | 257/628 |
| 5,212,404 | 5/1993 | Awano | 257/20 |
| 5,263,040 | 11/1993 | Hayakawa | 257/18 |

FOREIGN PATENT DOCUMENTS

| | | |
|---|---|---|
| 0144317 | 6/1987 | Japan . |
| 3-283427 | 12/1991 | Japan . |
| 4-65037 | 10/1992 | Japan . |

*Primary Examiner*—Robert P. Limanek
*Assistant Examiner*—David B. Hardy
*Attorney, Agent, or Firm*—Sughrue, Mion, Zinn, Macpeak & Seas

[57] ABSTRACT

A semiconductor epitaxial substrate, characterized in that a crystal is formed by epitaxial growth on a gallium arsenide single crystal substrate whose crystallographic plane azimuth is slanted from that of one of {100} planes at an angle of not more than 1°, that at least part of the epitaxial crystal is an $In_xGa_{(1-x)}As$ crystal (wherein $0<x<1$), and that the epitaxial growth is carried out by chemical vapor deposition. Since the $In_xGa_{(1-x)}As$ layer has reduced microscopic unevenness and reduced variation in thickness, the epitaxial substrate of the present invention can be used as a channel layer of a field effect transistor or as an active layer of a semiconductor laser to endow these devices with excellent characteristics.

7 Claims, 1 Drawing Sheet

5,569,954

EPITAXIAL IN$_x$GA$_{(1-x)}$AS HAVING A SLANTED CRYSTALLOGRAPHIC PLANE AZIMUTH

FIELD OF THE INVENTION

This invention relates to an epitaxial substrate of a compound semiconductor comprising a gallium arsenide (hereinafter sometimes referred to as GaAs) single crystal substrate having formed thereon a compound semiconductor epitaxial layer by epitaxial vapor phase growth.

BACKGROUND OF THE INVENTION

The field of various electronic devices using semiconductors has been and will be achieving rapid development. For the time being, silicon is used as a main semiconductor substrate. In recent years, compound semiconductors showing high-speed properties, such as GaAs, have been steadily developed.

Various semiconductor devices endowed with desired performance properties are generally obtained by forming a crystal layer having necessary characteristics on a single crystal substrate by various techniques, such as ion implantation, diffusion, and epitaxial growth. Above all, epitaxial growth has been spreading because it enables not only control of the amount of an impurity but control of the crystal composition or thickness over an extremely broad range and with high precision.

Known methods for epitaxial growth include liquid phase epitaxy, vapor phase epitaxy, and molecular beam epitaxy (hereinafter sometimes abbreviated as MBE), one of vacuum evaporation. Vapor phase epitaxy among them is capable of processing a large quantity of substrates under control and is therefore widely employed on an industrial scale. In particular, metalorganic chemical vapor deposition (hereinafter sometimes abbreviated as MOCVD), which comprises vaporizing an organometallic compound or a metal hydride of an atomic species that is to constitute an epitaxial layer and thermally decomposing the vapor on a substrate to cause crystal growth, has recently been extending its use on account of its applicability to a wide range of materials and suitability for precise control of crystal composition and thickness.

For example, a high electron mobility transistor, sometimes called a modulation doped transistor (MODFET) or a hetero-junction field effect transistor (HJFET), hereinafter inclusively referred to as HEMT, is one kind of field effect transistors (FET) and is of importance as an element of low noise amplifiers in microwave communication systems. The crystal used in HEMT is prepared by making a GaAs crystal and an AlGaAs crystal having necessary electronic characteristics successively grow in a necessary structure on a GaAs substrate by the above-mentioned vapor phase growth.

Crystals for semiconductor lasers, typical light-emitting devices, are also prepared in a similar manner, i.e., GaAs and AlGaAs layers endowed with necessary electrical characteristics, composition and thickness are made to grow on a substrate.

GaAs and an AlGaAs series are widely employed as materials for preparation of these devices since the lattice constant of the latter can be made to agree with that of the former at an arbitrary composition and can achieve various hetero-junctions while maintaining satisfactory crystal characteristics. It is also possible to laminate such a crystal layer as Al$_x$(In$_y$Ga$_{(1-y)}$)$_{(1-x)}$P (0<x<, 0<y<1) or In$_x$Ga$_{(1-x)}$As$_y$P$_{(1-y)}$ (0<x<1, 0<y<1) by selecting an appropriate composition range so as to match its lattice constant to that of GaAs.

Substrates whose plane azimuth is a {100} plane or its equivalent are generally used in various electron devices, such as the above-described field effect transistors and semiconductor lasers. However, in vapor phase epitaxy by MOCVD as illustrative above, a so-called off-azimuth substrate, which does not have an accurate {100} plane but a plane whose normal is slightly slanted from a <100> direction, is generally used.

There are several reasons for the use of an off azimuth substrate. For example, Uchida, et al. mention that the surface defect density and uniformity of a crystal layer can be improved by slanting a {100} plane to one of the <100> directions included in the {100} plane at an angle of 1° to 6° (See JP-B-4-65037). Maeda et al. describe that electron mobility can be improved by slanting a {100} plane to either direction at an angle of 3° to 9° in the preparation of a crystal for HEMT (see JP-A-3283427, the term "JP-A" as used herein means an "unexamined published Japanese patent application").

Thus, the effects of using an off-azimuth substrate widely covers improvements in crystal surface condition, uniformity, and crystal properties. To account for the mechanism of action of an off-azimuth substrate, it is considered that introduction of a slight slant results in formation of a periodical step structure on a terrace of a {100} plane, and each step proceeds in order at the crystal growth (step flow mode) to produce favorable effects on crystal properties.

Anyhow, with many merits as mentioned above, use of an off azimuth substrate in vapor phase epitaxy is regarded as one of fundamental techniques. Epitaxial substrates having a plane azimuth slanted from a <100> direction at an angle of from about 1° to 9° have been widely used on an industrial scale.

As previously stated, epitaxial growth has generally been conducted under such conditions that the lattice constant of an epitaxial growth layer may agree with that of a substrate used, i.e., lattice matching conditions. Accordingly, in using a GaAs substrate, Al$_x$(In$_y$Ga$_{(1-y)}$)$_{(1-x)}$P (0<x<1, 0<y<1) and In$_x$Ga$_{(1-x)}$As$_y$P$_{(1-y)}$ (0<x<, 0<y<1) having a specific composition as well as AlGaAs have been used as a main material for constituting an epitaxial growth layer.

Although In$_x$Ga$_{(1-x)}$As (0<x<1) has the qualities of a hetero-junction material because of its excellent electron transporting characteristics and possibility of greatly varying the energy gap thereof depending on the composition, it is incapable of matching its lattice constant to that of GaAs. It has therefore been impossible to form an In$_x$Ga$_{(1-x)}$As epitaxial growth layer on a GaAs substrate to provide a semiconductor epitaxial substrate having sufficient properties. Hence, GaAs as a substrate is often replaced with InP. For example, it has been studied to use an InP substrate whose lattice constant agrees with that of In$_x$Ga$_{(1-x)}$As wherein x is about 0.49.

However, the latest technological advancement has revealed that a reliable hetero-junction can be obtained even from a lattice mismatching system without causing reductions in crystal properties, such as dislocation, as far as the lattice mismatching is within the elastic deformation limit. The elastic deformation limit is given as functions of composition and layer thickness. For example, it is known that the following equation (1) theoretically applies for the elastic deformation limit of InGaAs for a GaAs substrate (see Mathews, et al., *J. Crystal Growth*, Vol. 27, p. 118

(1974) and ibid, Vol. 32, p. 265 (1976)). This equation has recently been proved practically correct through experimentation.

$$x = \frac{a(1-\sigma/4)[\ln(Lc\sqrt{2}/a)+1]}{0.14\sqrt{2}\pi Lc(1+\sigma)} \quad (1)$$

wherein Lc represents a critical layer thickness; a represents a lattice constant of GaAs; σ represents Poisson ratio; and x represents an In content.

Use of such a strain layer within a specific composition and thickness range has thus made it possible to produce an epitaxial substrate partly comprising an InGaAs layer on a GaAs substrate. For example, a layer of $In_xGa_{(1-x)}As$ wherein x is 0.15 having a thickness of about 15 nm can be prepared under usual crystal growth conditions without reducing the crystal properties. Such an $In_xGa_{(1-x)}As$ layer can be interposed between a GaAs buffer layer and an n-type AlGaAs electron-donating layer to prepare an epitaxial substrate which provides HEMT having more excellent noise characteristics than conventional HEMT comprising GaAs and AlGaAs. Additionally, such a thin layer of $In_xGa_{(1-x)}As$ can be utilized as an active layer on a GaAs substrate to provide a semiconductor laser having an emission wavelength band of from 900 to 1000 nm, which has not heretofore been attained in using a GaAs substrate.

In the preparation of the above-mentioned epitaxial substrate partly having a strain layer of InGaAs on a GaAs substrate, precise control of crystal growth on the order of several tens of nm is demanded. Therefore, MBE or MOCVD has been exclusively adopted as a means for crystal growth on account of their excellent control performance. However, MBE and MOCVD involve problems in terms of industrial productivity or quality of devices.

More specifically, although MBE is very excellent in controlling thin films, the crystal obtained by MBE involves many surface defects, which leads to a considerable reject rate, and also MBE has a low crystal growth rate and requires ultra-high vacuum, thus having production problems. MOCVD, on the other hand, produces a crystal layer with excellent surface conditions and achieves high productivity as having been conventionally used for general GaAs lattice matching systems. However, devices using an epitaxial substrate obtained by MOCVD do not always exhibit satisfactory characteristics as compared with those using an epitaxial substrate prepared by MBE with the design being equal.

For example, where an HEMT using a 15 nm thick $In_xGa_{(1-x)}As$ (x=0.15) as a channel layer is prepared by using a epitaxial substrate obtained by MOCVD, and radio-frequency characteristics are measured, the noise index at 12 GHz is found to be 0.8 to 0.9 dB. This value is about 0.1 to 0.2 dB greater than that of a device of the same design but using an epitaxial substrate prepared by MBE. As a result of parameter analysis, the main cause of the higher noise index is attributed to transconductance of HEMT. That is, the transconductance of HEMT using a crystal substrate obtained by MOCVD was found to be lower than that of HEMT using a crystal substrate obtained by MBE by about 5 to 15%.

An epitaxial substrate obtained by MOCVD is inferior in device characteristics, whereas that obtained by MBE has poor surface conditions and poor productivity. Under these circumstances, it has been keenly demanded to develop an epitaxial substrate comprising InGaAs on a GaAs substrate which exhibits excellent characteristics and has satisfactory surface conditions for ensuring a satisfactory yield of devices and can be supplied stably on an industrial scale.

SUMMARY OF THE INVENTION

Accordingly, an object of the present invention is to provide an epitaxial substrate comprising InGaAs on a GaAs substrate, which exhibits excellent characteristics and has satisfactory surface conditions for ensuring a satisfactory yield of devices and can be supplied stably on an industrial scale.

Another object of the present invention is to provide an epitaxial substrate containing an $In_xGa_{(1-x)}As$ layer, which is suitable as a channel layer of field effect transistors or an active layer of semiconductor lasers.

To accomplish the above objects, the inventors have conducted extensive investigations and, as a result, found that the above objects are accomplished by an epitaxial substrate obtained by epitaxial growth on a gallium arsenide single crystal substrate whose crystallographic plane azimuth is slanted from that of one of {100} planes at an angle of not more than 1°. The present invention has been reached based on this finding.

The present invention includes the following embodiments:

(1) A semiconductor epitaxial substrate, characterized in that a crystal is formed by epitaxial growth on a gallium arsenide single crystal substrate whose crystallographic plane azimuth is slanted from that of one of {100} planes at an angle of not more than 1°, that at least part of the epitaxial crystal is an $In_xGa_{(1-x)}As$ crystal (wherein 0<x<1), and that the epitaxial growth is carried out by chemical vapor deposition.

(2) A semiconductor epitaxial substrate as described in (1) above, characterized in that the composition and thickness of the $In_xGa_{(1-x)}As$ layer (Wherein 0<x<1) are within critical elastic deformation of said $In_xGa_{(1-x)}As$ layer (wherein 0<x<1).

(3) A semiconductor epitaxial substrate as described in (1) or (2) above, characterized in that the $In_xGa_{(1-x)}As$ layer (wherein 0<x<1) is a channel layer of a field effect transistor.

(4) A semiconductor epitaxial substrate as described in (1) or (2) above, characterized in that the $In_xGa_{(1-x)}As$ layer (wherein 0<x<1) is an active layer of a semiconductor laser.

(5) A semiconductor epitaxial substrate as described in (1) above, characterized in that the direction of slant from the crystallographic plane azimuth of a {100} plane is to the <0-11> direction.

DETAILED DESCRIPTION OF THE INVENTION

Figure 1:
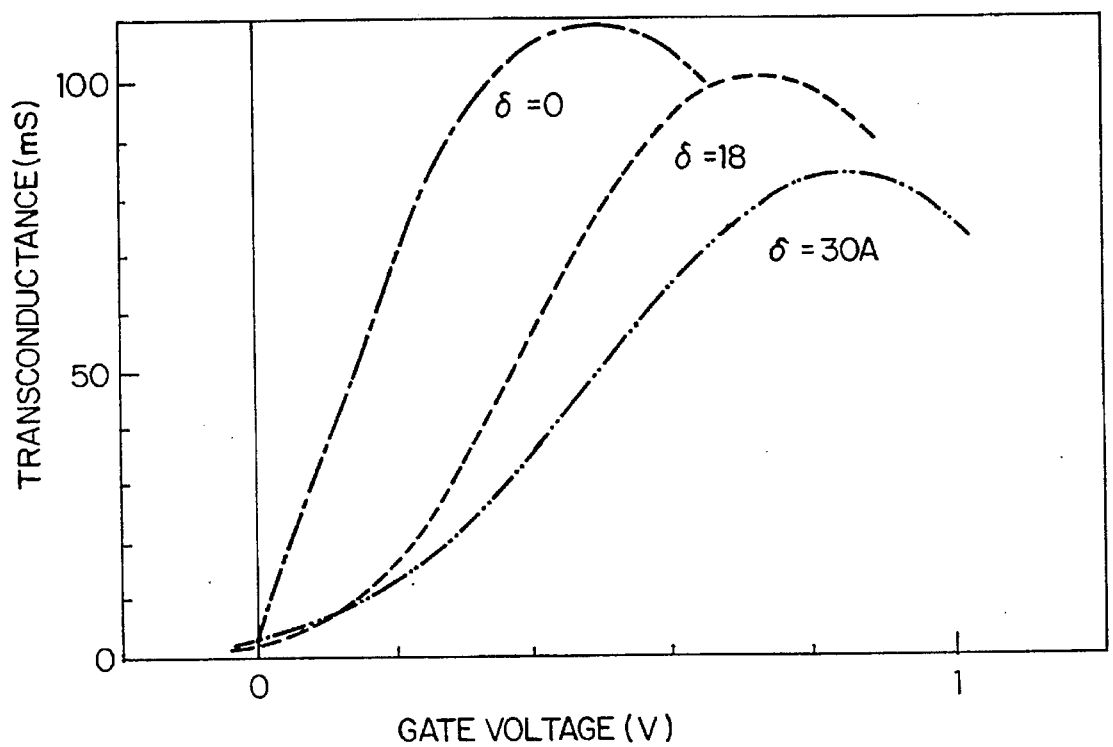
FIG. 1 is a graph showing the relationship between gate voltage and transconductance of HEMT (the standard deviation of unevenness of the channel layer is taken as a parameter).

The present invention will further be explained in greater detail. In what follows, the composition and thickness of each crystal layer are given by approximate ranges. In actually carrying out the invention, the range of composition or thickness is subject to variation according to various characteristics demanded for particular devices.

The surface of a high-resistant semi-insulating GaAs single crystal substrate is first degreased, etched, washed with water, and dried. The thus treated substrate is placed on a heating stand of a crystal growth furnace. After thoroughly purging the furnace with pure hydrogen, heating is started.

When the temperature is stabilized at an appropriate point, an arsenic precursor is introduced into the furnace, and a gallium precursor is subsequently fed thereto. After high purity GaAs is made to grow to a thickness of 0.1 to 2 µm over a prescribed period of time, an indium precursor is added to the furnace to make a non-doped $In_xGa_{(1-x)}As$ layer (wherein 0<x<1, preferably 0.1<x<0.3) grow to a thickness of 5 to 25 nm. Then, the feed of the indium precursor is ceased, and an aluminum precursor is added to make a high purity non-doped $Al_xGa_{(1-x)}As$ layer (wherein 0<x<1, preferably 0.1<x<0.3) grow to a thickness of 1 to 2 nm. This layer may be omitted in some cases.

Subsequently, an n-type dopant is added to the system to make an n-type $Al_xGa_{(1-x)}As$ layer (wherein 0<x<1, preferably 0.1<x<0.3) having a carrier concentration of $1\times10^{18}/cm^3$ to $3\times10^{18}/cm^3$ grow to a thickness of 30 to 50 nm. The feed of the aluminum precursor is stopped, and an n-type GaAs layer having a carrier concentration of $2\times10^{18}/cm^3$ to $10\times10^{18}/cm^3$ is made to grow to a thickness of 30 to 200 nm. Finally, the feed of the gallium precursor and then the arsenic precursor was stopped to terminate the crystal growth. After cooling, the epitaxial crystal-stacked substrate is taken out of the furnace to complete the crystal growth. The substrate temperature during the crystal growth usually ranges from about 600° to 800° C.

The epitaxial growth precursor to be used in the present invention preferably include organometallic compounds and/or metal hydrides.

Arsenic trihydride (arsine) is usually used as an arsenic precursor. A monoalkylarsine derived from arsine by substituting one hydrogen atom with an alkyl group having 1 to 4 carbon atoms is also useful.

Generally employed precursors of gallium, indium or aluminum include trialkylated compounds in which alkyl groups each having 1 to 3 carbon atoms are bonded to the respective metal atom, trihydrides in which hydrogen atoms are bonded to the respective metal atom, and compounds in which a trialkyl compound composed of an alkyl group having 1 to 4 carbon atoms and an element selected from the group consisting of nitrogen, phosphorus, and arsenic is coordinated to the above-mentioned trialkylated compound or trihydride.

The n-type dopant to be used includes a hydride of silicon, germanium, tin, sulfur or selenium and an alkylated compound of these elements having an alkyl group containing 1 to 3 carbon atoms.

For reference, a crystal section of a general epitaxial substrate for HEMT, which comprises a GaAs layer and an AlGaAs layer and containing no InGaAs layer in its epitaxial layer, was observed under a transmission electron microscope (TEM) having high resolution. As a result, unidirectionally aligned wavy unevenness having a height of about 1 nm at intervals of 30 to 40 nm was observed on the surface of the epitaxial crystal.

To the contrary, where an epitaxial layer containing an InGaAs layer was formed on a generally employed substrate having its azimuth slanted from the <100> direction to the <110> direction at an angle of, for example, 2°, the crystal section of the $In_xGa_{(1-x)}As$ layer (wherein x=0.15) formed on the GaAs buffer layer to a thickness of 15 nm (designed value), when observed in the same manner as described above, showed unevenness having a height varying from about 2 nm to the maximum of about 5 nm at intervals of about 200 to 400 nm.

For further reference, an $In_xGa_{(1-x)}As$ layer (wherein x=0.15) was made to grow according to the same procedures under the same conditions as used for the above-described crystal for HEMT, and then a 5 nm thick GaAs cap layer was formed thereon, followed by termination of crystal growth. Observation of the surface of the resulting sample under an atomic force microscope revealed that wavy unevenness having a height and intervals corresponding to those observed with TEM ran in the direction perpendicular to the <110> direction.

The semiconductor epitaxial substrate according to the present invention is characterized in that a crystal layer is formed by epitaxy on a gallium arsenide single crystal substrate whose crystallographic plane azimuth is slanted from that of one of the {100} planes at an angle of not greater than 1°. The slant angle of the plane azimuth is preferably from 0.05° to 0.6°, and still preferably from 0.1° to 0.5°.

An $In_xGa_{(1-x)}As$ layer-containing semiconductor epitaxial substrate which can be obtained by chemical vapor deposition using a substrate having such a specific slant angle of plane azimuth shows reduced unevenness on the surface of the $In_xGa_{(1-x)}As$ layer. More specifically, the height of the surface unevenness of the $In_xGa_{(1-x)}As$ layer of the epitaxial substrate of the invention is not more than about 1 nm, which is the same as in an epitaxial substrate for HEMT comprising GaAs and AlGaAs layers of general type and containing no InGaAs layer in its epitaxial layer. Therefore, where the semiconductor epitaxial substrate of the present invention is applied to transistors, etc., the transconductance and pinch-off characteristics hereinafter explained are improved.

While not clear, the cause of the periodical unevenness on the crystal surface seems to be as follows. On a substrate whose plane azimuth is slanted from the {100} plane, which has been conventionally employed in MOCVD, there are atomic steps in the direction perpendicular to the direction of the slant of plane azimuth. In the case of GaAs, at an angle of slant of 2°, the steps each have a height of 0.283 nm at average intervals of 8.1 nm as calculated. Accordingly, the periodical unevenness to such a degree appears to essentially exist on the crystal surface. It is also known that some of the steps gather to form so-called macrosteps under some conditions.

In view of the above circumstances, it seems that a macrostep composed of about 3 to 4 atomic steps, a quotient of 1 nm divided by 0.283 nm, should be produced on the crystal for HEMT using GaAs and AlGaAs layers of general type, and that greater macrosteps would be produced on the crystal containing an InGaAs layer.

As an angle of the slant from the {100} plane, the main plane azimuth, increases, the unevenness of the InGaAs layer surface increases. Thus, the crystallographic plane azimuth slanted from the <100> direction at an angle usually of 2° or more, which has been widely used in vapor phase epitaxy as in MOCVD, is unsuitable for the system containing an InGaAs layer. By reducing the angle of slant to 1° or less, the surface unevenness can be reduced to about 1 nm, which is on the same level of that of an ordinary epitaxial crystal layer containing no InGaAs layer.

The direction of the slant from the {100} plane, the main plane azimuth, is preferably close to the <0-11> direction or a crystallographically equivalent direction thereto. If it is close to the <0-1-1> direction perpendicular to the <0-11> direction, or a crystallographically equivalent direction thereto, the unevenness of the crystal surface further increases. The conventionally used <110> direction, which is in the middle between the <0-11> direction and the <0-1-1> direction, or a crystallographically equivalent direction thereto is not the best direction.

In the expressions of directions used herein, the <0-11> and <0-1-1> directions are equivalent to the <0$\bar{1}$1> and <0$\bar{1}\bar{1}$> directions, respectively.

The relationship of the microscopic unevenness of an InGaAs layer with device characteristics will be explained below.

Where the interval of unevenness is approximately equal to or longer than the gate length, the crystal layer thickness under the gate is thickened in some parts and thinned in other parts. In field effect transistors, the difference in thickness of a layer under the gate appears as a difference in the threshold voltage. Accordingly, in a field effect transistor formed on such an uneven surface, there are portions differing in threshold value within one transistor, resulting in deterioration in transconductance and pinch-off characteristics.

FIG. 1 shows simulated dependence of transconductance on gate voltage taking a standard deviation of unevenness height ($\delta$: nm) as a parameter. It is seen that, with unevenness of about 30 Å, the maximum transconductance is reduced by nearly 30% and the pinch-off characteristics are also deteriorated. These results are in good agreement with those actually observed in currently available HEMT prepared by MOCVD using an InGaAs layer.

As described in the foregoing, the variation in InGaAs layer thickness is reduced in the epitaxial substrate of the present invention. It is preferable that the composition and thickness of an $In_xGa_{(1-x)}As$ layer (0<x<1) fall within the range of critical elastic deformation of that layer, since the variation of the layer thickness is further reduced.

The range of the critical elastic deformation as referred to in the present invention is specified by the above-mentioned equation (1) by Mathews et al., and the critical layer thickness Lc can be obtained from the compositional ratio of In, while the compositional ratio of In can be led from the critical layer thickness Lc.

Where the epitaxial substrate comprising the $In_xGa_{(1-x)}As$ layer (0<x<1) is used as a channel layer in a field effect transistor, there can be prepared HEMT with excellent performance and free from reductions in characteristics due to unevenness of the channel layer. Where the epitaxial substrate is used for semiconductor lasers with the $In_xGa_{(1-x)}As$ layer (0<x<1) as an active layer, satisfactory oscillation characteristics having no scatter of oscillation wavelength can be obtained.

Examples of the present invention will be described, but the present invention should not be construed as being limited thereto.

EXAMPLE 1

An atomic force microscope "TMX-2000" manufactured by Topometrix Co., Ltd. was used.

Precursors for metalorganic chemical vapor deposition used herein were 3.6 to $4.7\times10^{-5}$ mol/min of trimethylgallium, 0.2 to $1.5\times10^{-5}$ mol/min of trimethylaluminum, 0.2 to $1.1\times10^{-5}$ mol/min of trimethylindium, and 4.7 to $24\times10^{-4}$ mol/min of arsine. As a dopant, $8.9\times10^{-10}$ mol/min of disilane was used. Hydrogen (9 l/min), purified by passing through a palladium membrane, was used as a carrier gas. Thermal decomposition was conducted on a semi-insulating GaAs substrate heated at 650° C. under a pressure of 0.1 atm to grow an epitaxial GaAs, AlGaAs or InGaAs layer at a rate of growth of 1 to 3 μm/hr.

Specific compositions and layer thicknesses were as follows: Non-doped GaAs or $Al_xGa_{(1-x)}As$ (x=0.04 to 0.2) was grown on a substrate to a thickness of 0.3 to 1 μm to form a buffer layer, and an non-doped GaAs buffer layer and an $In_{0.15}Ga_{0.85}As$ layer were then grown thereon to a thickness of 50 nm and 15 nm, respectively.

In accordance with general production of an epitaxial substrate for HEMT, a 2 nm thick non-doped $Al_{0.25}Ga_{0.75}As$ spacer layer, a 35 nm thick silicon-doped $Al_{0.25}Ga_{0.75}As$ electron-donating layer, and a 50 to 150 nm thick silicon-doped GaAs contact layer were successively grown on the InGaAs layer. Separately, a sample in which only a 5 nm thick GaAs layer as a protective layer was directly formed on the InGaAs layer was also prepared for the sake of surface observation of the InGaAs layer. In these samples, a GaAs substrate whose plane azimuth was slanted from the {100} plane to the <0-11> direction at an angle of 0.4° was used as the substrate.

Observation of the surface of the resulting crystal under an atomic force microscope revealed a step-wise difference in level of about 1 nm formed in the direction perpendicular to the <0-11> direction.

A recess gate type FET having a gate length of 1 μm was then prepared by using the above-prepared epitaxial substrate for general HEMT, comprised of an n-type AlGaAs electron-donating layer having grown thereon a 1000 Å thick silicon-doped GaAs layer (n=$3\times10^{18}$/cm³). The three-terminal transmission characteristics with a direct current were measured. As a result, the K value, a measure for device performance, was as satisfactory as 350 to 380 mS/Vmm.

COMPARATIVE EXAMPLE 1

Crystal growth was carried out in the same manner as in Example 1, except for using a substrate whose plane azimuth was slanted from the {100} plane to the <110> direction at an angle of 2°, and the epitaxial crystal layer was evaluated in the same manner as in Example 1. Many steps having a height of about 4 nm were observed at intervals of about 300 to 400 nm in the direction perpendicular to the <110> direction.

A recess gate type FET having a gate length of 1 μm was then prepared in the same manner as in Example 1 by using the prepared epitaxial substrate for general HEMT, comprised of an n-type AlGaAs electron-donating layer having grown thereon a 1000 Å thick silicon-doped GaAs layer (n=$3\times10^{18}$/cm³). The three-terminal transmission characteristics with a direct current were measured. As a result, the K value, a measure for device performance, was 270 to 310 mS/Vmm, proving that the device was inferior to that of Example 1 in transmission characteristics.

COMPARATIVE EXAMPLE 2

Crystal growth was carried out in the same manner as in Example 1, except for using a substrate whose plane azimuth was slanted from the {100} plane to the <0-11> direction at an angle of 5°, and the crystal layer was evaluated in the same manner as in Example 1. Many steps having a height of about 5 nm were observed at intervals of about 400 nm in the direction perpendicular to the <0-11> direction.

COMPARATIVE EXAMPLE 3

Crystal growth was carried out in the same manner as in Example 1, except for using a substrate whose plane azimuth was slanted from the {100} plane to the <0-1-1> direction at an angle of 5°, and the crystal layer was evaluated in the same manner as in Example 1. Many steps having a height of about 11 nm were observed at irregular intervals in the direction perpendicular to the <011> direction.

COMPARATIVE EXAMPLE 4

Crystal growth and evaluation were carried out in the same manner as in Example 1, except for successively growing a 2 nm thick $Al_{0.3}Ga_{0.7}As$ spacer layer, a 35 nm thick silicon-doped $Al_{0.3}Ga_{0.7}As$ electron-donating layer, and a 5 nm thick Si-doped GaAs layer on the InGaAs layer and using a substrate whose plane azimuth was slanted from the {100} plane to the <110> direction at an angle of 2°.

As a result of evaluation, steps having a height of about 3 nm were observed at intervals of about 60 to 80 nm in the direction perpendicular to the <110> direction. The electron mobility at 77 K was found to be 14400 cm$^2$/Vs as obtained by Hall measurement.

COMPARATIVE EXAMPLE 5

Crystal growth and evaluation were carried out in the same manner as in Comparative Example 4, except for using a substrate whose plane azimuth was slanted from the {100} plane to the <0-1-1> direction at an angle of 2°. As a result, surface unevenness having a height of about 3 nm was observed at intervals of about 70 to 90 nm in the direction perpendicular to the <0-1-1> direction.

COMPARATIVE EXAMPLE 6

Crystal growth and evaluation were carried out in the same manner as in Comparative Example 4, except for using a substrate whose plane azimuth was slanted from {100} plane to the <0-1-1> direction at an angle of 2°. Surface unevenness having a height of about 2 nm was observed at intervals of about 50 nm in the direction perpendicular to the <0-11> direction.

COMPARATIVE EXAMPLE 7

Crystal growth and evaluation were carried out in the same manner as in Comparative Example 4, except for using a substrate whose plane azimuth was slanted from the {100} plane to the <110> direction at an angle of 5°. Surface unevenness having a height of about 5 nm was observed at intervals of 200 to 400 nm in the direction perpendicular to the <110> direction.

The electron mobility at 77 K was 2900 cm$^2$/Vs.

According to the present invention, the InGaAs layer-containing epitaxial layer formed on a GaAs substrate has reduced microscopic unevenness on the InGaAs layer thereof and reduced variation in thickness of the InGaAs layer thereof. Therefore, application of the epitaxial substrate of the present invention to various electronic devices brings about considerable improvements of device characteristics.

For example, the epitaxial substrate of the present invention, when used in a field effect transistor in which an $In_xGa_{(1-x)}As$ layer (0<x<1) serves as a channel layer, provides HEMT with excellent performance and free from reductions in characteristics due to unevenness of the channel layer. Where the epitaxial substrate of the present invention is used for semiconductor lasers with the $In_xGa_{(1-x)}As$ layer (0<x<1) serving as an active layer, satisfactory oscillation characteristics with no scatter of oscillation wavelength can be obtained.

Further, since an epitaxial layer having excellent characteristics can be formed even by MOCVD, the excellent productivity of MOCVD can be taken advantage of in production of the above-described devices at low cost. The present invention thus has a considerable industrial significance.

While the invention has been described in detail and with reference to specific examples thereof, it will be apparent to one skilled in the art that various changes and modifications can be made therein without departing from the spirit and scope thereof.

What is claimed is:

1. A semiconductor epitaxial substrate having an $In_xGa_{(1-x)}As$ layer (wherein 0<x<1), wherein said $In_xGa_{(1-x)}As$ layer (wherein 0<x<1) is formed by chemical vapor deposition epitaxial growth on a gallium arsenide single crystal substrate having a crystallographic plane azimuth slanted from that of one of {100} planes at an angle of about 0.05° to 0.6°.

2. The semiconductor epitaxial substrate as claimed in claim 1, characterized in that the composition and thickness of the $In_xGa_{(1-x)}As$ layer (wherein 0<x<1) are within an elastic deformation limit of said $In_xGa_{(1-x)}As$ layer (wherein 0<x<1) for said gallium arsenide single crystal substrate.

3. The semiconductor epitaxial substrate as claimed in claim 1, characterized in that the gallium arsenide single crystal substrate crystallographic plane azimuth is slanted from the crystallographic plane azimuth of the {100} plane in the <0-11> direction.

4. A field effect transistor, wherein a channel layer of said field effect transistor comprises an $In_xGa_{(1-x)}As$ layer (wherein 0<x<1) of a semiconductor epitaxial substrate, wherein said $In_xGa_{(1-x)}As$ layer (wherein 0<x<1) is formed by chemical vapor deposition epitaxial growth on a gallium arsenide single crystal substrate having a crystallographic plane azimuth slanted from that of one of {100} planes at an angle of about 0.05° to 0.6°.

5. The field effect transistor as claimed in claim 4, wherein the composition and thickness of the $In_xGa_{(1-x)}As$ layer (wherein 0<x<1) are within an elastic deformation limit of said $In_xGa_{(1-x)}As$ layer (wherein 0<x<1) for said gallium arsenide single crystal substrate.

6. A semiconductor laser, wherein an active layer of said semiconductor laser comprises an $In_xGa_{(1-x)}As$ layer (wherein 0<x<1) of a semiconductor epitaxial substrate, wherein said $In_xGa_{(1-x)}As$ layer (wherein 0<x<1) is formed by chemical vapor deposition epitaxial growth on a gallium arsenide single crystal substrate having a crystallographic plane azimuth slanted from that of one of {100} planes at an angle of about 0.05° to 0.6°.

7. The semiconductor laser as claimed in claim 6, wherein the composition and thickness of the $In_xGa_{(1-x)}As$ layer (wherein 0<x<1) are within an elastic deformation limit of said $In_xGa_{(1-x)}As$ layer (wherein 0<x<1) for said gallium arsenide single crystal substrate.

\* \* \* \* \*